United States Patent
Aygun et al.

(10) Patent No.: US 11,621,227 B2
(45) Date of Patent: Apr. 4, 2023

(54) POWER DELIVERY FOR EMBEDDED BRIDGE DIE UTILIZING TRENCH STRUCTURES

(71) Applicant: Intel Corporation, Santa Clara, CA (US)

(72) Inventors: Kemal Aygun, Tempe, AZ (US); Zhiguo Qian, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/540,141

(22) Filed: Dec. 1, 2021

(65) Prior Publication Data

US 2022/0093516 A1    Mar. 24, 2022

Related U.S. Application Data

(63) Continuation of application No. 16/634,864, filed as application No. PCT/US2017/053960 on Sep. 28, 2017, now Pat. No. 11,222,848.

(51) Int. Cl.
| | |
|---|---|
| *H01L 23/52* | (2006.01) |
| *H01L 21/00* | (2006.01) |
| *H01L 23/538* | (2006.01) |
| *H01L 21/48* | (2006.01) |
| *H01L 23/48* | (2006.01) |

(Continued)

(52) U.S. Cl.
CPC ........ *H01L 23/5381* (2013.01); *H01L 21/486* (2013.01); *H01L 21/4846* (2013.01); *H01L 23/3128* (2013.01); *H01L 23/481* (2013.01); *H01L 23/49816* (2013.01); *H01L 23/49822* (2013.01); *H01L 23/49838* (2013.01);

(Continued)

(58) Field of Classification Search
CPC ..... H01L 2224/81; H01L 24/16; H01L 24/13; H01L 24/81; H01L 24/17; H01L 23/5381; H01L 23/49838; H01L 23/49816; H01L 23/3128; H01L 21/486; H01L 21/4857; H01L 23/49822; H01L 23/5226; H01L 23/53295

See application file for complete search history.

(56) References Cited

U.S. PATENT DOCUMENTS

| | | | |
|---|---|---|---|
| 8,338,870 B2 | 12/2012 | Kim | |
| 9,119,313 B2 | 8/2015 | Zhang | |
| 9,275,971 B2 | 3/2016 | Chiu | |
| 9,997,446 B2 | 6/2018 | Kim | |

(Continued)

FOREIGN PATENT DOCUMENTS

KR    10-1087830    11/2011

OTHER PUBLICATIONS

International Search Report and Written Opinion for International Patent Application No. PCT/US2017/053960 dated Jun. 28, 2018, 11 pgs.

(Continued)

*Primary Examiner* — Alonzo Chambliss
(74) *Attorney, Agent, or Firm* — Schwabe, Williamson & Wyatt, P.C.

(57) ABSTRACT

Methods/structures of joining package structures are described. Those methods/structures may include a die disposed on a surface of a substrate, an interconnect bridge embedded in the substrate, and at least one vertical interconnect structure disposed through a portion of the interconnect bridge, wherein the at least one vertical interconnect structure is electrically and physically coupled to the die.

25 Claims, 9 Drawing Sheets

(51) Int. Cl.
*H01L 23/498* (2006.01)
*H01L 23/31* (2006.01)
*H01L 23/00* (2006.01)
*H01L 23/522* (2006.01)
*H01L 23/532* (2006.01)

(52) U.S. Cl.
CPC .... *H01L 23/5226* (2013.01); *H01L 23/53295* (2013.01); *H01L 24/13* (2013.01); *H01L 24/16* (2013.01); *H01L 24/17* (2013.01); *H01L 24/81* (2013.01); *H01L 2224/81* (2013.01)

(56) References Cited

U.S. PATENT DOCUMENTS

| | | |
|---|---|---|
| 10,833,052 B2 | 11/2020 | Shih |
| 11,222,848 B2 * | 1/2022 | Aygun ................ H01L 23/3128 |
| 2005/0237778 A1 | 10/2005 | Kitsukawa |
| 2014/0070380 A1 | 3/2014 | Chiu et al. |
| 2014/0264791 A1 | 9/2014 | Manusharow et al. |
| 2015/0028486 A1 | 1/2015 | Liu et al. |
| 2016/0141234 A1 | 5/2016 | We |
| 2016/0204049 A1 | 7/2016 | Chiu et al. |
| 2016/0329284 A1 | 11/2016 | We et al. |

OTHER PUBLICATIONS

International Preliminary Report on Patentability for International Patent Application No. PCT/US2017/053960, dated Apr. 9, 2020, 10 pgs.

* cited by examiner

POWER DELIVERY FOR EMBEDDED BRIDGE DIE UTILIZING TRENCH STRUCTURES

CROSS-REFERENCE TO RELATED APPLICATION

This patent application is a continuation of U.S. patent application Ser. No. 16/634,864, filed Jan. 28, 2020, which is a U.S. National Phase Application under 35 U.S.C. § 371 of International Application No. PCT/US2017/053960, filed Sep. 28, 2017, entitled "POWER DELIVERY FOR EMBEDDED BRIDGE DIE UTILIZING TRENCH STRUCTURES," which designates the United States of America, the entire disclosure of which are hereby incorporated by reference in their entirety and for all purposes.

BACKGROUND

Embedded multi-die interconnect bridge (EMIB) technology may include embedding a bridge die into a microelectronic package substrate, such as into an organic package substrate. A bridge die may comprise several metal layers for input/output (I/O) within a bulk silicon substrate. The bridge die is typically isolated from the package by a material, such as by a dielectric material located between a bottom portion of the bridge die and the package substrate. Due to high I/O density, EMIB structures can have high signal bandwidth. However, routing power delivery paths from a bridge die structure to a microelectronic package can present issues in terms of resistance and inductance challenges, for example.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
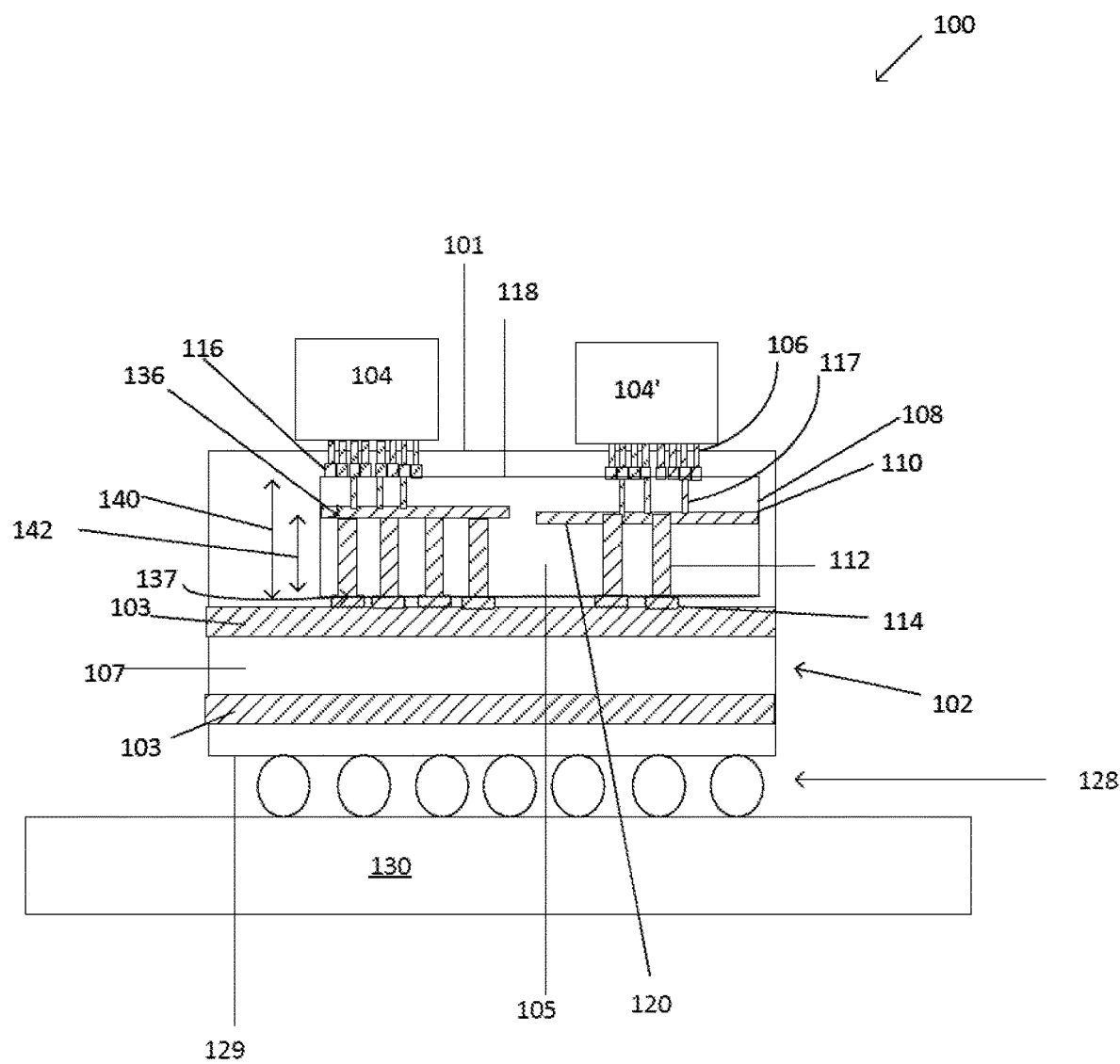
FIG. 1a represents a cross-sectional view of a package structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the die may comprise a microprocessor, a graphics processor, a signal processor, a network processor, a chipset, etc. In one embodiment, a die may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on a die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

For example, the terminals on a substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter a reflow temperature).

Embodiments of methods of forming packaging structures, such as methods of forming vertical power delivery structures incorporated in bridge dies, are described. Those methods/structures may include a die disposed on a surface of a substrate, an interconnect bridge embedded in the substrate, and at least one vertical interconnect structure disposed through a portion of the interconnect bridge, wherein the at least one vertical interconnect structure is electrically and physically coupled to the die. The embodiments herein enable a vertical power delivery path to provide a short and effective current flowing path, which reduces resistance and inductance.

FIGS. 1a-1d illustrate cross-sectional and top views of embodiments of package structures/assembles comprising vertical interconnect structures disposed within interconnect bridge die. In FIG. 1a (cross-sectional view), a package structure 100 is depicted which may comprise any type of microelectronic package 100, such as a multi-die package, for example. The package structure 100 may include a die/device 104, 104' wherein two devices are shown, and wherein the die 104,104' may be disposed on a first surface 101 of the substrate 102. The substrate 102 may comprise any number of suitable materials, and may comprise an organic substrate in an embodiment. The die 104, 104' may comprise any suitable type of die, such as a microprocessor, a chipset, a graphics device, a wireless device, a memory device, an application specific integrated circuit, or the like. Any number of die may be included on the package substrate, and may include a plurality of stacked die, in an embodiment.

The die 104, 104' may comprise high density die 104, 104', and may include very fine pitched conductive structures (less than about 50 microns pitch between adjacent features, for example), such as I/O conductive bumps, for example. In an embodiment, the die 104, 104' may comprise a high bandwidth memory die. The die 104 104' may be physically and electrically coupled to the substrate 102 by a plurality of conductive interconnect structures 106.

An interconnect bridge 108 may be embedded in the substrate 102 below the die 104, 104'. The interconnect bridge 108 may be surrounded by a layer of dielectric material within the substrate 102 (not shown). In an embodiment, at least a portion of the plurality of conductive interconnect structures 106 may be disposed on a first surface 118 of the interconnect bridge 108 and/or may be connected to conductive pads 116 disposed on the first surface 118 of the interconnect bridge 108.

The interconnect bridge 108 may comprise a bulk silicon portion 105 and a plurality of interconnect structures 110 disposed therein. The plurality of interconnect structures 110 may couple the die 104, 104' to a first terminal end 136 of at least one vertical interconnect structure 112 disposed within the interconnect bridge 108. The at least one vertical interconnect structure 112 may comprise a conductive material with a dielectric material disposed on a surface thereon, such that the conductive material is surrounded by the dielectric material. The dielectric material may comprise such materials as silicon dioxide, silicon nitride, non-conductive polymer materials, and the like, and may comprise a thickness of about 0.1 microns to about 10 microns. The conductive material of the interconnect bridge 108 may comprise such materials as copper and its alloys, or any other suitable conductive material that is required by the particular design requirements.

The at least one vertical interconnect 112 may comprise a variety of shapes, such as a square shape, a rectangular shape, or a circular shape, for example. In an embodiment, a diameter of the at least one vertical interconnect structure 112 may comprise about 30 microns to about 200 microns. The at least one vertical structure 112 may extend through at least a portion the interconnect bridge 108, and a second terminal end 137 of at least one vertical interconnect structure 112 may be physically coupled with conductive pads 114 disposed at least partially within the substrate 102, wherein the conductive pads 114 may be disposed at least partially on a second surface 120 of the interconnect bridge 108. In an embodiment, the at least one vertical interconnect structure 112 may comprise a height 142 that is greater than about one half of a height 140 of the interconnect bridge 108.

The pads 114 may be physically and electrically coupled to conductive layers 103 disposed within the substrate 102, and may be separated from each other by a substrate dielectric material 107. A plurality of solder balls 128 may be disposed on a second surface 129 of the substrate 102, which may couple the substrate 102 to a board 130, such as a motherboard, for example. The board 130 may comprise any suitable type of circuit board or other substrate capable of providing electrical communication between one or more of the various components disposed on the board 130.

In one embodiment, for example, the board 130 may comprise a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers-electrical signals between the components coupled with the board 130. However, it should be understood that the disclosed embodiments are not limited to the above-described PCB and, further, that board 130 may comprise any other suitable substrate.

The at least one vertical interconnect structure 112 may comprise a portion of a vertical signal and may comprise a power delivery path for devices, such as the die/devices 104, 104' that are communicatively coupled with the package structure 100. By providing vertical interconnect structures 112, power may be delivered vertically from the substrate package 102 to the die 104, 104'. In an embodiment, the package plane which the interconnect bridge 108 lands on can be designated to power nets that need to be supplied vertically. Underneath die power bumps 106, vias 117 connecting to conductive pads 116 disposed on the interconnect bridge 108 may be used to connect to the meshed power plane structures 110, which provide for the vertical delivery path. Similarly, the vertical interconnect structures 112 can also be used for ground power nets.

Figure 1B:
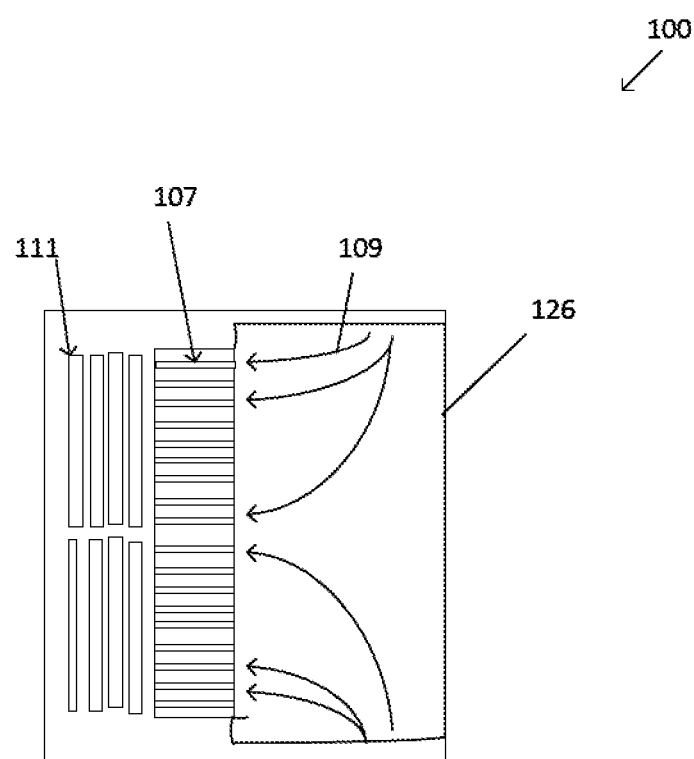
FIGS. 1b-1d represents top views of package structures according to embodiments.

The embodiments additionally include a horizontal power delivery path 109 of a horizontal power net 126, wherein power and ground bumps 107 for I/O circuits of a device, such as a HBM die, for example, may be arranged in long rows 111 as shown in FIG. 1b (top view of package structure 100). Since the bridge die 108 includes vertical interconnect structures such as conductive trench structures 112, in an embodiment, a vertical power delivery path is provided in addition to a horizontal power delivery path.

The vertical power delivery path of the embodiments included herein significantly reduce resistance and inductance, and thus reduce power noise for I/O signaling.

By using the conductive trench structures in the silicon interconnect bridge as the vertical power delivery path to connect the package planes, a short and effective current flowing path is provided. The vertical power delivery is much more effective than the horizontal power delivery for the long and narrow power bump groups. The vertical interconnect structures can be designed and fabricated as conductive structures that have larger dimensions, such as 30 to 200 micron diameter, for example, to reduce the resistance and inductance.

Therefore, the vertical interconnect structures described herein provide good current flowing path by electrically connecting to the package power plane located near the second surface of the package substrate. The power rail current can directly flow through the vertical interconnect structures 112 and the vias in the bridge to reach the package surface and the power bumps. In an embodiment, the package plane 103 which the interconnect bridge 108 lands on may be designated to power nets or ground nets that need to be supplied vertically, and die power bumps and stacked vias on the surface of the interconnect die may be used to connect to meshed power plane structures located on the interconnect bridge die/structure.

Figure 1C:
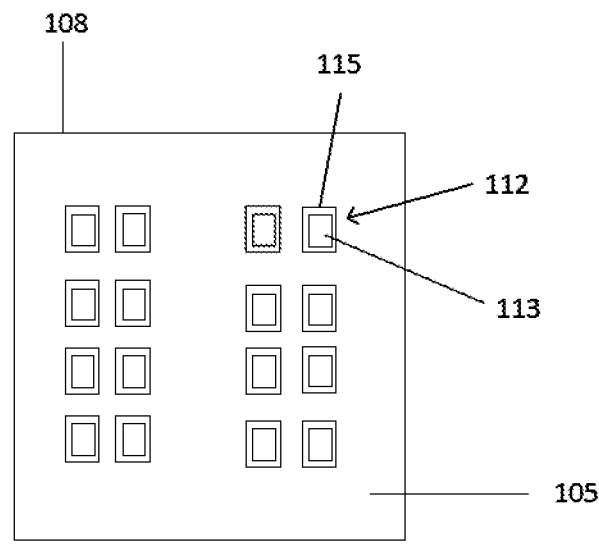
Figure 1D:
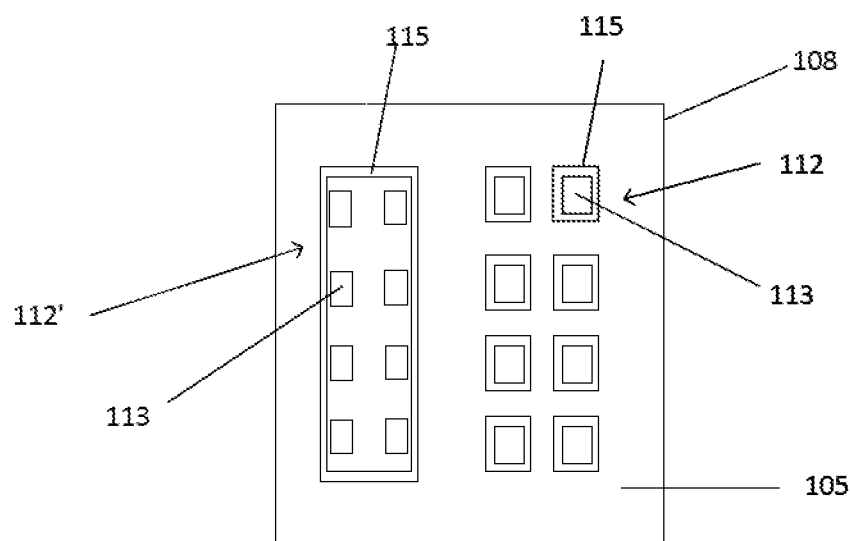

FIG. 1c depicts a top view of the interconnect bridge 108, wherein a plurality of vertical interconnect structures 112 are disposed. Each of the individual vertical interconnect structures 112 comprise a conductive portion 113, and a dielectric portion 115 surrounding the conductive portion 113, disposed within the silicon material 105 of the interconnect bridge 108. In FIG. 1d (depicting a top view of the interconnect bridge 108), groups of individual conductive vias 113 of the vertical interconnect structures 112 may be isolated by a common dielectric material 115 to form a group vertical interconnect structure 112'. Both group vertical interconnect structures 112' and individual vertical interconnect structures 112 may be disposed with silicon material 105 of the interconnect bridge structure 108.

Figure 2A:
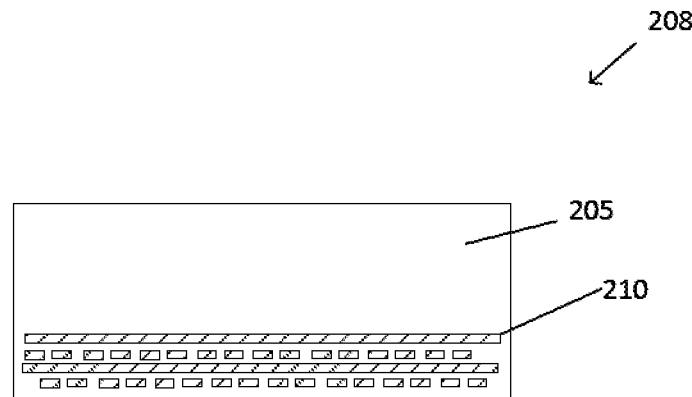
FIGS. 2a-2f represent cross-sectional views of methods of forming an interconnect bridge according to embodiments.
Figure 2B:
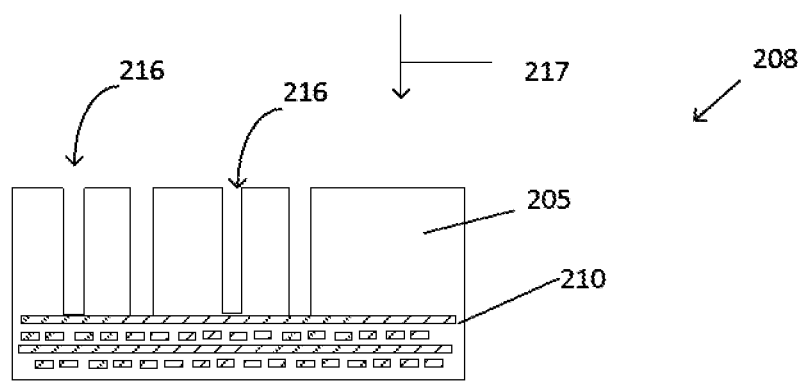

FIGS. 2a-2f depicts a cross sectional view of methods of forming the package structures of the embodiments herein. In FIG. 2a, an interconnect bridge 208 may comprise a silicon material 205 and a plurality of conductive interconnect structures 210 that are disposed within the silicon material 205 of the interconnect bridge structure 208. A removal process 217, which may comprise a trench etch process 217 and/or a laser drilling process, may be employed to form trenches/openings 216 in the silicon material 205 (FIG. 2b). The openings 216 may expose a portion of the conductive interconnect structures 210. A cleaning process may be performed subsequent to forming the openings 216.

Figure 2C:
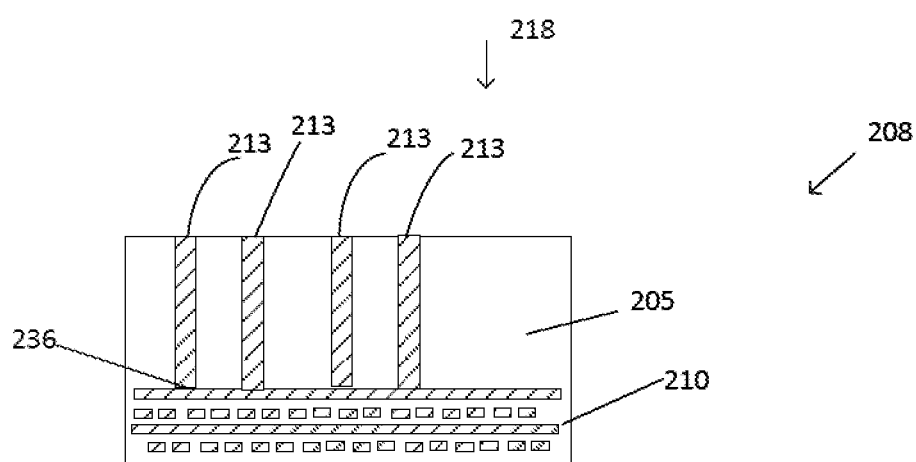

A formation process 218, which may comprise a deposition process, such as a sputtering and/or chemical vapor deposition (CVD) process 218, for example, may be employed to form a conductive material/vias 213 within the trench openings 216 (FIG. 2c). A first terminal end 236 of the conductive material/vias 213 disposed within the openings 216 may be physically and electrically coupled with portions of the conductive interconnect structures 210. Any number and shape of conductive vias 213 may be formed within the silicon material 205, according to the particular application. The diameter of the conductive structures/vias 213 may comprise about 30 microns to about 200 microns, in an embodiment, but may comprise any suitable size according to the particular application. The conductive vias 213 may at least partially extend through a portion of the silicon material 205 of the interconnect bridge 208.

Figure 2D:
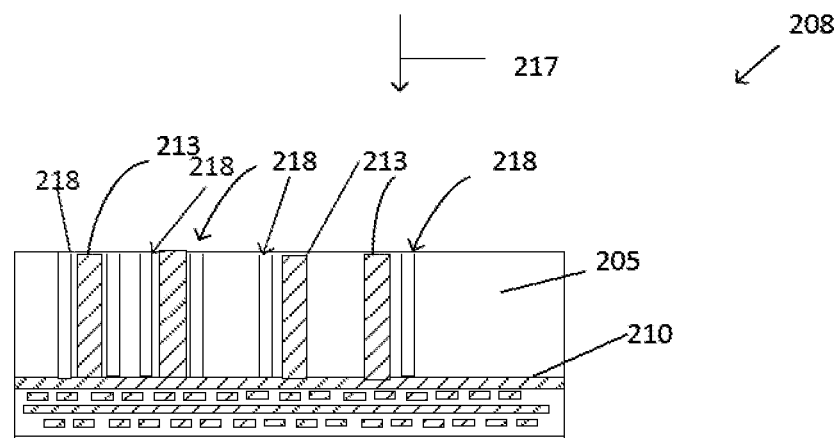
Figure 2E:
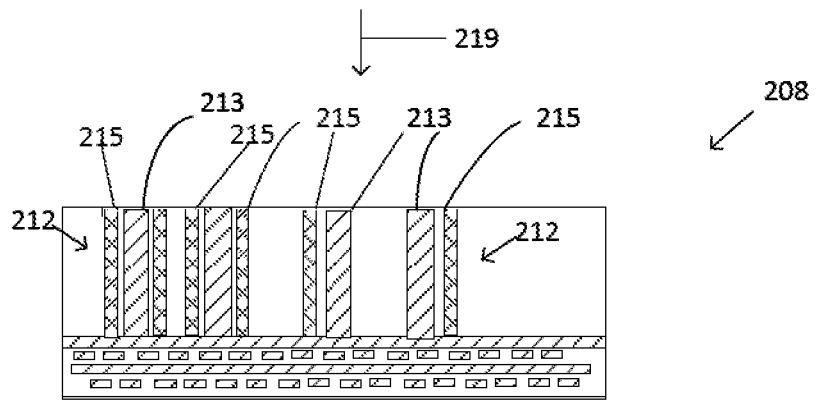

In an embodiment, isolation openings/trenches 218 may be formed in the silicon material 205 adjacent the conductive vias 213 (FIG. 2d). The isolation openings 219 may be formed by using a silicon laser drill/etching process 217, for example. The openings 219 may comprise a diameter/width of about 100 microns to about 200 microns in an embodiment. An isolation material 215 may be formed in the openings 219 by employing a formation process 219, such as a chemical vapor deposition process 219, for example (FIG. 2e). The isolation material 215 may comprise dielectric materials such as silicon dioxide, silicon nitride, non-conductive polymers, and the like, and may comprise a thickness of between about 1 micron to about 100 microns. The dielectric/isolation material may be formed around/adjacent individual conductive vias 213 and/or around/adjacent groups of conductive vias 213 to form a plurality of vertical interconnect structures 212 within the silicon material 205 of the interconnect bridge 208. In an embodiment, the dielectric material 215 can be directly adjacent to the conductive material 213, or there may be silicon substrate material between the dielectric material 215 and the conductive material 213.

Figure 2F:
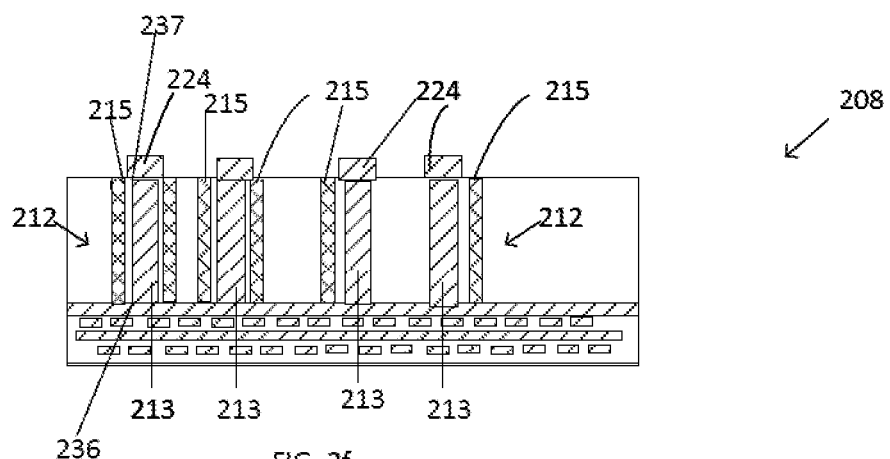

Conductive pads 224 may be formed on a second terminal end 237 of each of the vertical interconnect structures 212, wherein the conductive pads 224 may comprise conductive materials, such as copper and copper alloys, for example (FIG. 2f). The second terminal ends 237 of the vertical interconnect structures 212 may be electrically bonded to interconnect layers disposed within a package substrate, such as those shown in FIG. 1a, for example. The interconnect layers may comprise package power or ground plane metal layers, in an embodiment.

Figure 3A:
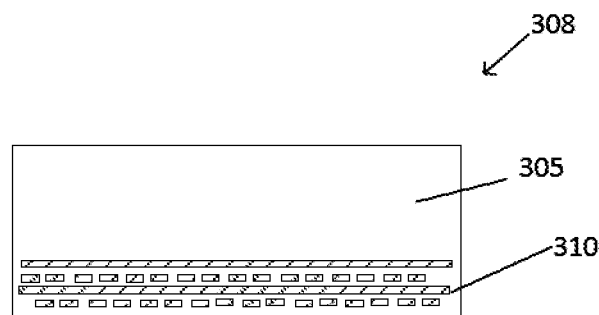
FIGS. 3a-3f represent cross-sectional views of methods of forming an interconnect bridge according to embodiments.
Figure 3B:
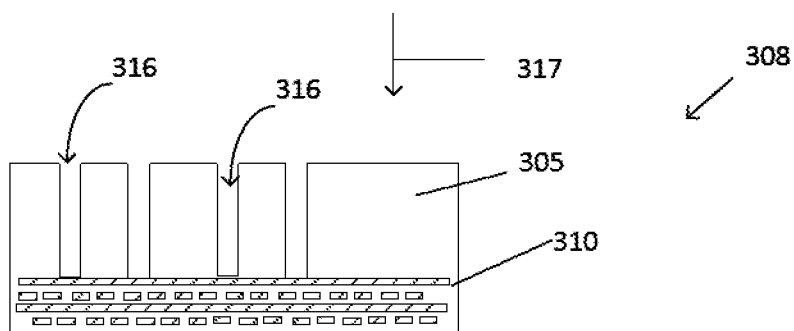

FIGS. 3a-3f depicts a cross sectional view of methods of forming the package structures of the embodiments herein. In FIG. 3a, an interconnect bridge 308 may comprise a silicon material 305 and a plurality of conductive interconnect structures 310 that are disposed within the silicon material 305. A removal process 317, which may comprise a trench etch process 317 and/or a laser drilling process, may be employed to form trenches/openings 316 in the silicon material 305 (FIG. 3b). The openings 316 may expose a portion of the conductive interconnect structures 310. A cleaning process may be performed subsequent to forming the openings 316.

Figure 3C:
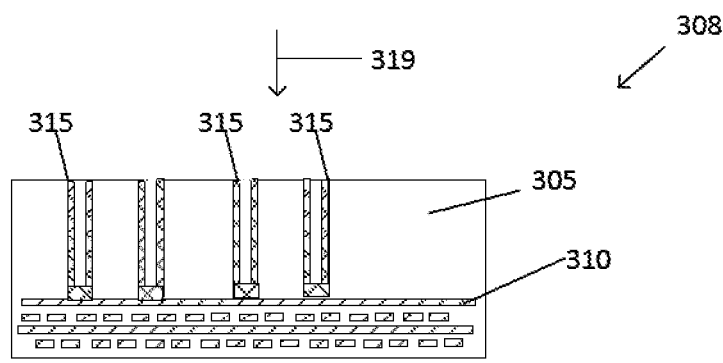
Figure 3D:
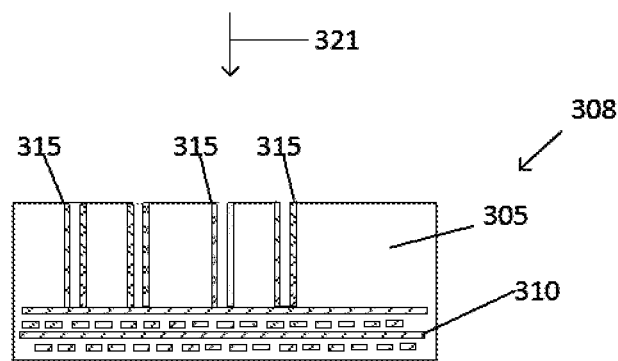

A formation process 319, which may comprise a deposition process, such as a sputtering and/or chemical vapor deposition (CVD) process 319, for example, may be employed to form an isolation material 315 in the openings 319 for example (FIG. 3c). The isolation material 315 may comprise dielectric materials such as silicon dioxide, silicon nitride, non-conductive polymers, and the like. The dielectric/isolation material 315 may be formed on surfaces of the openings 319, and may comprise a conformal lining in the openings 319, wherein a portion of the openings 319 remain. In an embodiment, the isolation material 315 may comprise a thickness of about 50 nm to about 10 microns. A bottom portion of the isolation material 315 may be removed by an etching or laser drilling process 321 to expose the underlying conductive interconnect structures 310 (FIG. 3d).

Figure 3E:
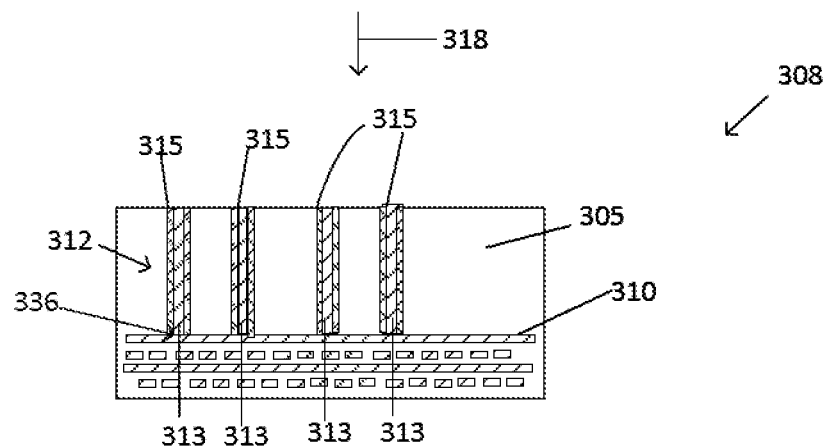

A conductive material 313 may be formed within the opening 319 adjacent the isolation material 315 disposed in the openings 319, by utilizing a deposition process 318, such as a sputtering and/or chemical vapor deposition (CVD) process 318, for example (FIG. 3e). Thus, a plurality of vertical interconnect structures 312 may be formed in the silicon material 305 of the interconnect bridge 308. A first terminal end 336 of the vertical interconnect structures 312 may be physically and electrically coupled with portions of the conductive interconnect structures 310. Any number and shape of vertical interconnect structures 312 may be formed within the interconnect bridge 308, according to the particular application. The diameter of the vertical interconnect structures 312 may comprise about 30 microns to about 200 microns, in an embodiment, but may comprise any suitable size according to the particular application. The vertical interconnect structures 312 may at least partially extend through a portion of the silicon material 305 of the interconnect bridge 308.

Figure 3F:
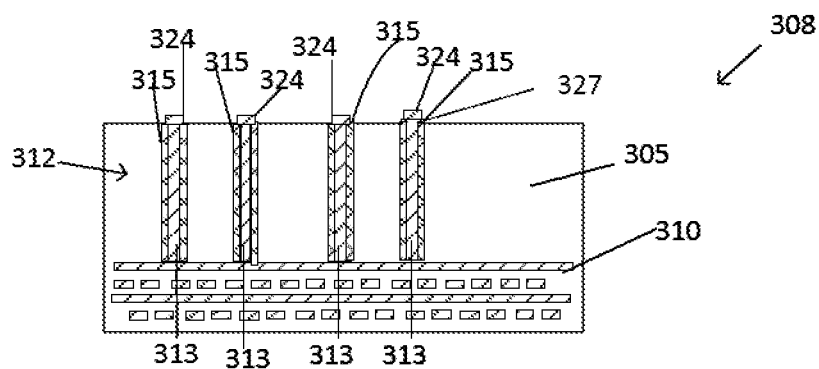

Conductive pads 324 may be formed on a second terminal end 327 of each of the vertical interconnect structures 312, wherein the conductive pads 324 may comprise conductive materials, such as copper and copper alloys, for example (FIG. 3f). The second terminal ends 327 of the vertical interconnect structures 312 may be electrically bonded to interconnect layers disposed within a package substrate, such as those shown in FIG. 1a, for example. The interconnect layers may comprise package power or ground plane metal layers, in an embodiment. In other embodiments, the vertical interconnect structures may be formed prior to the interconnect layers disposed within the substrate.

The embodiments described herein significantly improves the power delivery performance. Delivering power vertically shortens the pathway distance and results in less parasitic resistance and inductance. The vertical power delivery pathway of the embodiments enable the reduction of static and AC inductance by about 40-50 percent, in some cases. The conductive vertical interconnect structures offer new power delivery architecture/schemes. For example, I/O structures that may comprise multiple power rails, may not allow package surface routing, which can result in power delivery design bottlenecks. However, using vertical conductive interconnect structures can provide alternative vertical power delivery schemes.

The vertical interconnect structures for power delivery described herein can be fabricated with relatively large dimensions as compared with typical through-silicon via structures, and conventional laser etching/drilling process may be employed without the need for advanced fabrication processes, thus reducing cost. With both architecture and design changes, the package structures of the embodiments herein provide deliver power through both vertical and horizontal paths. Power delivery with the extra vertical path can significantly improve the power net performance.

For example the DC voltage distribution of the power net of the embodiments herein may provide a voltage drop improvement from about 13.4 mV to about 6.3 mV, resulting in a 52% reduction. The AC power delivery may result in the power delivery loop inductance being reduced from about 234 pH to about 148 pH, showing a 37% reduction. In addition, the vertical interconnect structures described herein may be used for both power rails and ground Vss rails, which enables voltage drop and AC noise reduction on Vss rails.

Figure 4:
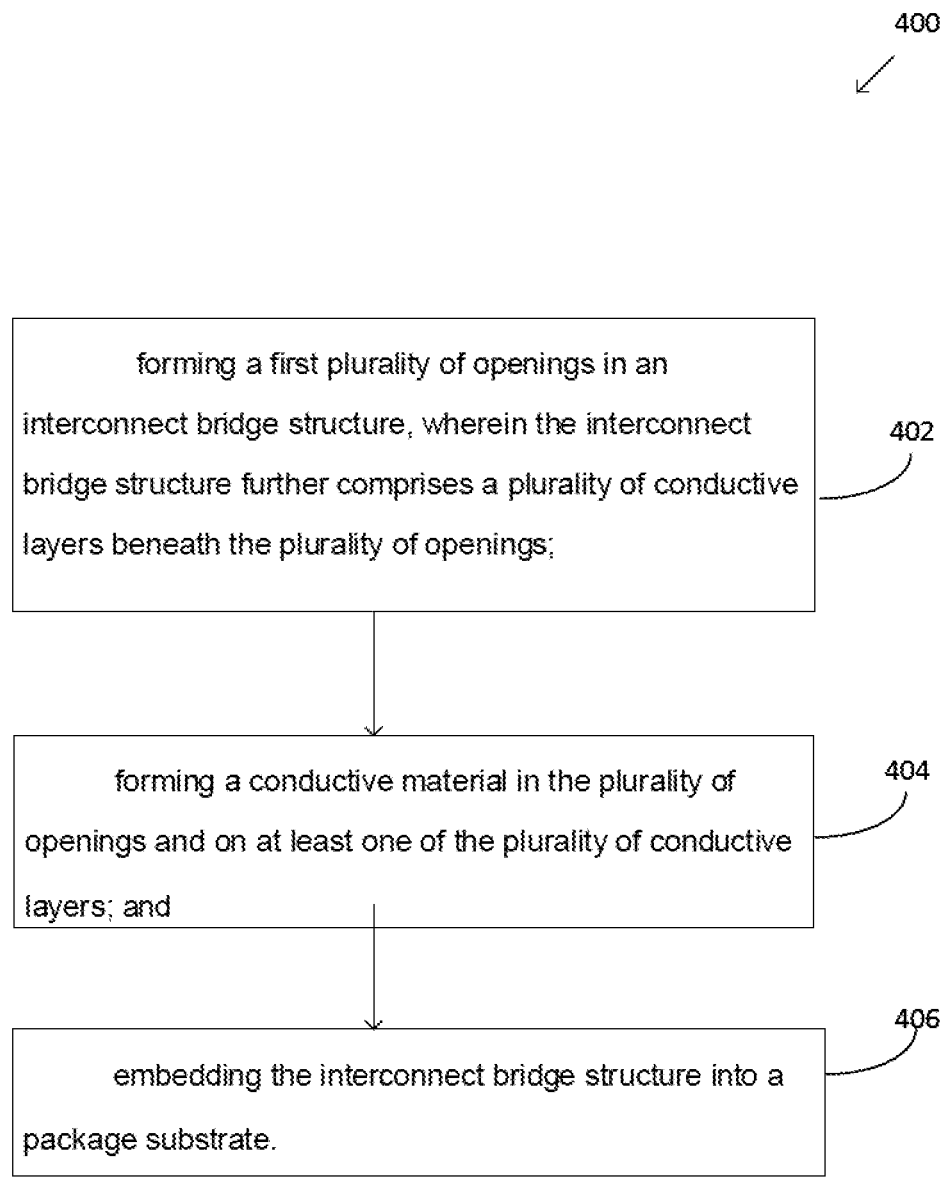
FIG. 4 represents a flow chart of a method of forming package structures according to embodiments.

FIG. 4 depicts a method 400 according to embodiments herein. At step 402, a first plurality of openings may be formed in an interconnect bridge structure, wherein the interconnect bridge structure further comprises a plurality of conductive layers beneath the plurality of openings. The openings may be formed by using a laser drilling process and/or an etching process, for example. The interconnect bridge structure may comprise a bulk silicon portion, and the plurality of openings may be formed by laser drilling openings, which may comprise about 30 micron to about 200 micron diameter openings, in an embodiment, through the bulk silicon portion.

A cleaning process may be performed subsequent to the formation of the plurality of openings. At step 404, a conductive material may be formed in the plurality of openings and on at one of the plurality of conductive layers. The conductive material may comprise such conductive materials as copper and copper alloys, for example. The conductive material may comprise a portion of plurality of vertical interconnect structures, which may extend through at least half of a height of the interconnect bridge. The conductive material may further comprise a dielectric material adjacent a surface of the conductive material.

At step 406, the interconnect bridge structure may be embedded into a package substrate. The interconnect bridge structure comprising the plurality of vertical interconnect structures provides a vertical power delivery pathway, which may be an additional power delivery pathway to an existing horizontal delivery pathway.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
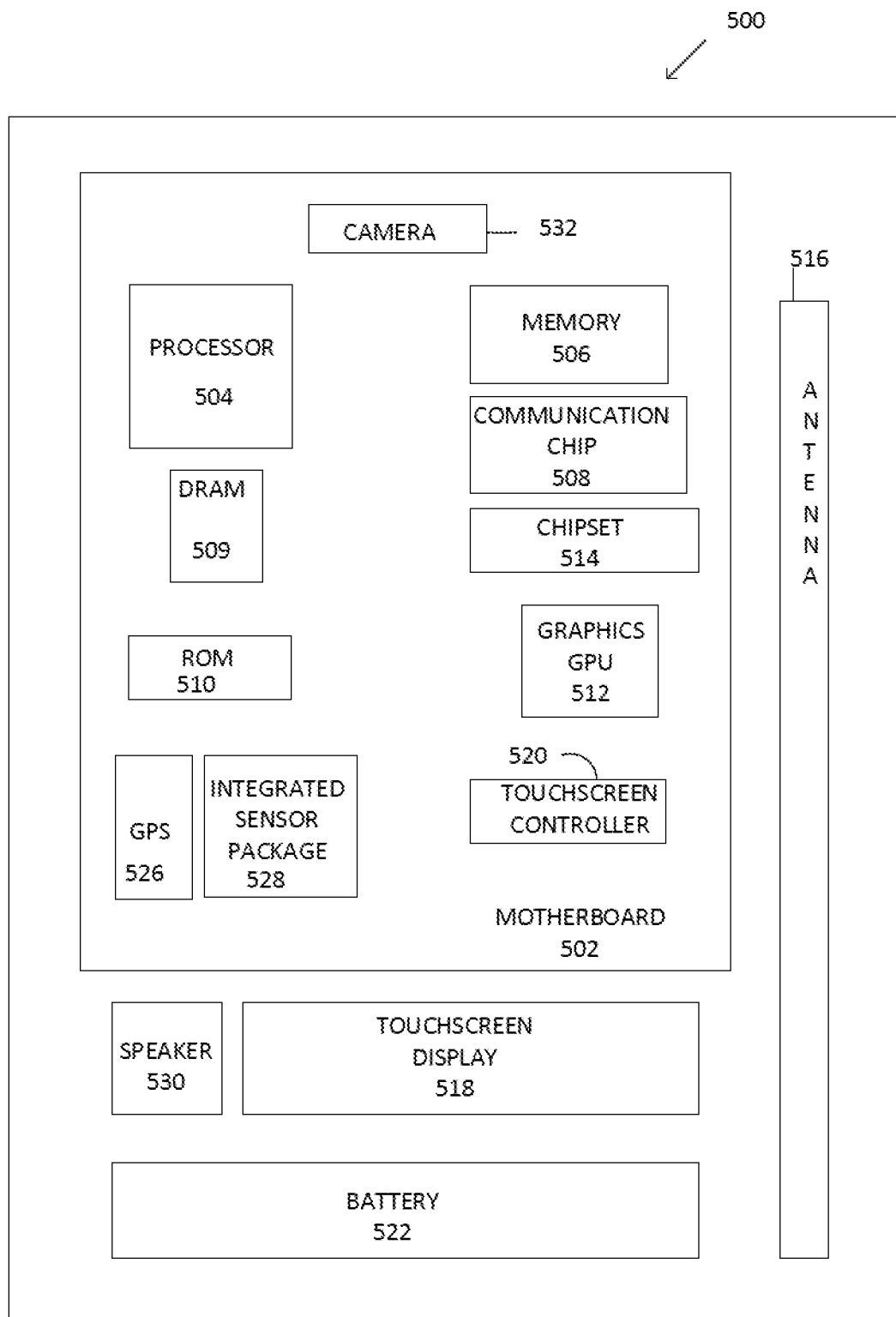
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, package structures/assemblies, such as is depicted in FIG. 1a, wherein an interconnect bridge comprising a plurality of vertical interconnect structures is embedded within a package substrate. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising: a die disposed on a surface of a substrate; an interconnect bridge embedded in the substrate; and at least one vertical interconnect structure disposed through a portion of the interconnect bridge, wherein the at least one vertical interconnect structure is electrically and physically coupled to the die.

Example 2 includes the microelectronic package structure of example 1, wherein the at least one vertical interconnect structure comprises a conductive material disposed in a central portion of the at least one via, and a dielectric material disposed on a surface of the conductive material.

Example 3 includes the microelectronic package structure of example 1 wherein a plurality of conductive interconnect structures disposed on the die electrically couple the die with the at least one vertical interconnect structures.

Example 4 includes the microelectronic package structure of example 1 wherein the die comprises a high bandwidth memory die.

Example 5 includes the microelectronic package structure example 1 wherein the at least one vertical interconnect structure comprises one of a ground vertical interconnect structure or a power vertical interconnect structure.

Example 6 includes the microelectronic package structure of example 1 wherein the at least one vertical interconnect structure comprises a conductive pad electrically and physically coupled with a conductive structure disposed in the substrate, beneath the embedded interconnect bridge.

Example 7 includes the microelectronic package structure of example 1 wherein the at least one vertical interconnect structure comprises a portion of a vertical power delivery path.

Example 8 includes the microelectronic package structure of example 1 wherein a plurality of vertical interconnect structures are disposed beneath the die, and a dielectric material surrounds the plurality of vertical interconnect structures.

Example 9 is a method of forming a microelectronic package structure comprising: forming a first plurality of openings in an interconnect bridge structure, wherein the interconnect bridge structure further comprises a plurality of conductive layers beneath the plurality of openings; forming a conductive material in the plurality of openings and on at least one of the plurality of conductive layers; and embedding the interconnect bridge structure into a package substrate.

Example 10 includes the method of forming the microelectronic package structure of example 9 wherein forming the first plurality of openings comprises laser drilling a bulk silicon portion of the interconnect bridge to form the first plurality of openings.

Example 11 includes the method of forming the microelectronic package structure of example 9 further comprising forming a second plurality of openings adjacent the conductive material.

Example 12 includes the method of forming the microelectronic package structure of example 11 further comprising forming a dielectric material in the second plurality of openings.

Example 13 includes the method of forming the microelectronic package structure of example 9 further comprising forming a conformal layer of dielectric material in the openings prior to forming the conductive material in the openings, and forming the conductive material on the conformal dielectric material.

Example 14 includes the method of forming the microelectronic package structure of example 9 further comprising forming conductive pads on a terminal end of the conductive material, wherein the conductive pad extends a distance from a surface of the interconnect bridge.

Example 15 includes the method of forming the microelectronic package structure of example 14 further including physically and electrically coupling the conductive pad to a conductive layer disposed in the package substrate.

Example 16 includes the method of forming the microelectronic package structure of example 9, further comprising coupling a die to a surface of the substrate package, wherein a plurality of conductive interconnect structures disposed on a surface of the die are physically and electrically coupled to at least one of the conductive layers disposed within the interconnect bridge.

Example 17 is a microelectronic system, comprising: a board; a microelectronic package attached to the board, wherein the microelectronic package comprises: a die disposed on a surface of a substrate; an interconnect bridge embedded at least partially in the package substrate; at least one vertical interconnect structure disposed through at least a portion of the interconnect bridge, wherein the at least one vertical interconnect structure is electrically and physically coupled to the die.

Example 18 includes the microelectronic system of example 17 wherein the interconnect bridge comprises a silicon material, and wherein a first terminal end of the at least one vertical interconnect structure is disposed on a conductive pad that is physically and electrically coupled with a conductive layer disposed within the substrate.

Example 19 includes the microelectronic system of example 18 wherein the conductive pad is disposed at least partially within the substrate.

Example 20 includes the microelectronic system of example 18 wherein the interconnect bridge comprises a plurality of interconnect structures disposed within the interconnect bridge, that are coupled to a second terminal end of the at least one vertical interconnect structure, and wherein the plurality of interconnect structures is coupled to die interconnect structures disposed at least partially within the package substrate.

Example 21 includes the microelectronic system of example 17 wherein individual ones of the at least one vertical interconnect structure comprise a dielectric material disposed adjacent a surface of a conductive via.

Example 22 includes the microelectronic system of example 21 wherein groups of the conductive vias comprise a dielectric material surrounding the group of conductive vias.

Example 23 includes the microelectronic system of example 17 wherein the die comprises a high bandwidth memory die.

Example 24 includes the microelectronic system of example 23 wherein the high bandwidth memory die comprises a horizontal power delivery path and a vertical power delivery path.

Example 25 includes the microelectronic package system of example 24 wherein the at least one vertical interconnect structure comprises one of a rectangular shape, a circular shape or a square shape.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus, the embodiments are not limited to the structures described herein.

What is claimed is:

1. A microelectronic package structure comprising:
a die disposed on a surface of a substrate;
an interconnect bridge embedded in the substrate, the interconnect bridge comprising a power structure and at least one vertical interconnect structure, the power structure comprising a first plurality of conductive lines along a first direction and a second plurality of conductive lines along a second direction different than the first direction, the at least one vertical interconnect structure disposed through only a portion of the interconnect bridge, and the at least one vertical interconnect structure vertically beneath and coupled to the power structure, wherein the at least one vertical interconnect structure is electrically coupled to the die.

2. The microelectronic package structure of claim 1, wherein the first plurality of conductive lines along the first direction is in a first layer, and the second plurality of conductive lines along the second direction is in a second layer different than the first layer.

3. The microelectronic package structure of claim 1, wherein a plurality of conductive interconnect structures disposed on the die electrically couple the die with the at least one vertical interconnect structure.

4. The microelectronic package structure of claim 1, wherein the die comprises a memory die.

5. The microelectronic package structure of claim 1, wherein the at least one vertical interconnect structure comprises one of a ground vertical interconnect structure or a power vertical interconnect structure.

6. The microelectronic package structure of claim 1, wherein the at least one vertical interconnect structure is physically and electrically coupled with a conductive pad disposed on a conductive structure located within the substrate, wherein the conductive structure is located beneath the embedded interconnect bridge.

7. The microelectronic package structure of claim 1, wherein the at least one vertical interconnect structure comprises a portion of a vertical power delivery path.

8. The microelectronic package structure of claim 1, wherein the at least one vertical interconnect structure comprises a group of conductive vias surrounded by a dielectric material.

9. A method of forming a microelectronic package structure comprising:
forming a first plurality of openings only partially through an interconnect bridge structure, wherein the interconnect bridge structure further comprises a plurality of conductive layers beneath the plurality of openings, the plurality of conductive layers comprising a power structure exposed by the first plurality of openings, the power structure comprising a first plurality of conductive lines along a first direction and a second plurality of conductive lines along a second direction different than the first direction;
forming a conductive material in the plurality of openings and on the power structure; and
embedding the interconnect bridge structure into a package substrate.

10. The method of forming the microelectronic package structure of claim 9, wherein the first plurality of conductive lines along the first direction is in a first layer, and the second plurality of conductive lines along the second direction is in a second layer different than the first layer.

11. The method of forming the microelectronic package structure of claim 9, further comprising forming a second plurality of openings adjacent the conductive material.

12. The method of forming the microelectronic package structure of claim 11, further comprising forming a dielectric material in the second plurality of openings.

13. The method of forming the microelectronic package structure of claim 9, further comprising forming a conformal layer of dielectric material in the openings prior to forming the conductive material in the openings, and then forming the conductive material on the conformal dielectric material.

14. The method of forming the microelectronic package structure of claim 9, further comprising forming a conductive pad on a terminal end of the conductive material, wherein the conductive pad extends a distance from a surface of the interconnect bridge.

15. The method of forming the microelectronic package structure of claim 14, further comprising physically and electrically coupling the conductive pad to a conductive layer disposed in the package substrate.

16. The method of forming the microelectronic package structure of claim 9, further comprising coupling a die to a surface of the substrate package, wherein a plurality of conductive interconnect structures disposed on a surface of the die are physically and electrically coupled to at least one of the conductive layers disposed within the interconnect bridge.

17. A microelectronic system, comprising:
a board;
a microelectronic package attached to the board, wherein the microelectronic package comprises:
a die disposed on a surface of a package substrate;
an interconnect bridge embedded at least partially in the package substrate, the interconnect bridge comprising a power structure and at least one vertical interconnect structure, the power structure comprising a first plurality of conductive lines along a first direction and a second plurality of conductive lines along a second direction different than the first direction, the at least one vertical interconnect structure disposed through only a portion of the interconnect bridge, and the at least one vertical interconnect structure vertically beneath and coupled to the power structure, wherein the at least one vertical interconnect structure is electrically coupled to the die.

18. The microelectronic system of claim 17, wherein the first plurality of conductive lines along the first direction is in a first layer, and the second plurality of conductive lines along the second direction is in a second layer different than the first layer.

19. The microelectronic system of claim 17, wherein the interconnect bridge comprises a silicon material, and wherein a first terminal end of the at least one vertical interconnect structure is disposed on a conductive pad that is physically and electrically coupled with a conductive layer disposed within the package substrate.

20. The microelectronic system of claim 17, wherein an additional die is disposed on the surface of the package substrate adjacent the die.

21. The microelectronic system of claim 19, wherein the interconnect bridge comprises a plurality of interconnect structures disposed within the interconnect bridge that are coupled to a second terminal end of the at least one vertical interconnect structure, and wherein the plurality of interconnect structures is coupled to a plurality of die interconnect structures disposed at least partially within the package substrate.

22. The microelectronic system of claim 17, wherein individual ones of the at least one vertical interconnect structure comprise a dielectric material disposed adjacent a surface of a conductive via.

23. The microelectronic system of claim 17, wherein the at least one vertical interconnect comprises groups of the conductive vias surrounded by a dielectric material.

24. The microelectronic system of claim 17, wherein the die comprises a memory die.

25. The microelectronic system of claim 24, wherein the die comprises a high bandwidth memory die, wherein the high bandwidth memory die comprises a horizontal power delivery path and a vertical power delivery path.

* * * * *